US012568727B2

(12) United States Patent
Hu

(10) Patent No.: US 12,568,727 B2
(45) Date of Patent: Mar. 3, 2026

(54) DOUBLE-SIDED DISPLAY PANEL AND DOUBLE-SIDED DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventor: Xiaobo Hu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 466 days.

(21) Appl. No.: 17/622,805

(22) PCT Filed: Dec. 17, 2021

(86) PCT No.: PCT/CN2021/139350
§ 371 (c)(1),
(2) Date: Dec. 25, 2021

(87) PCT Pub. No.: WO2023/103057
PCT Pub. Date: Jun. 15, 2023

(65) Prior Publication Data
US 2024/0030272 A1 Jan. 25, 2024

(30) Foreign Application Priority Data
Dec. 10, 2021 (CN) .......................... 202111506579.5

(51) Int. Cl.
| | |
|---|---|
| *H10H 29/14* | (2025.01) |
| *G09G 3/32* | (2016.01) |
| *H10H 20/857* | (2025.01) |

(52) U.S. Cl.
CPC ............. *H10H 29/142* (2025.01); *G09G 3/32* (2013.01); *H10H 20/857* (2025.01)

(58) Field of Classification Search
None
See application file for complete search history.

(56) References Cited

U.S. PATENT DOCUMENTS

| | | | |
|---|---|---|---|
| 7,170,225 B2 * | 1/2007 | Han ..................... | H10K 59/176 313/503 |
| 2004/0263064 A1 | 12/2004 | Huang | |

(Continued)

FOREIGN PATENT DOCUMENTS

| | | |
|---|---|---|
| CN | 103227186 A | 7/2013 |
| CN | 104061495 A | 9/2014 |

(Continued)

OTHER PUBLICATIONS

Dictionary.com: https://www.dictionary.com/browse/area (Year: 2024).*

(Continued)

*Primary Examiner* — Chad M Dicke
*Assistant Examiner* — Jeremy Daniel Watts
(74) *Attorney, Agent, or Firm* — PV IP PC; Christopher S. Ruprecht; Wei Te Chung

(57) ABSTRACT

A double-sided display panel and a double-sided display device are provided. The double-sided display panel includes a light-emitting layer, a first connecting assembly, and a second connecting assembly. The light-emitting layer includes a first light-emitting unit and a second light-emitting unit. The first connecting assembly includes a first positive electrode plate and a first negative electrode plate, which are respectively electrically connected to the first light-emitting unit. The second connecting assembly includes a second positive electrode plate and a second negative electrode plate, which are respectively electrically (Continued)

connected to the connecting area of the second light-emitting unit. This can realize a double-sided display without increasing the thickness of the display panel.

18 Claims, 4 Drawing Sheets

(56) References Cited

U.S. PATENT DOCUMENTS

| | | | | |
|---|---|---|---|---|
| 2007/0164665 | A1* | 7/2007 | Hu | H10K 59/128 |
| | | | | 313/504 |
| 2010/0176751 | A1* | 7/2010 | Oshio | H10H 20/857 |
| | | | | 257/E33.001 |
| 2013/0292711 | A1* | 11/2013 | Ogihara | H10H 29/14 |
| | | | | 257/88 |
| 2015/0370129 | A1* | 12/2015 | Qiu | G02F 1/133603 |
| | | | | 349/69 |
| 2019/0035974 | A1* | 1/2019 | Li | G09G 3/32 |
| 2020/0058625 | A1* | 2/2020 | Chen | H01L 25/0753 |
| 2021/0066504 | A1* | 3/2021 | Ren | H10D 30/6719 |
| 2021/0226085 | A1* | 7/2021 | Yang | H10H 20/856 |
| 2021/0327340 | A1* | 10/2021 | Fan | G09G 3/32 |
| 2022/0293834 | A1* | 9/2022 | Yokoyama | H01L 25/0753 |
| 2022/0352118 | A1* | 11/2022 | Harumoto | H01L 25/0753 |
| 2024/0155905 | A1* | 5/2024 | Zhu | H10K 59/128 |

FOREIGN PATENT DOCUMENTS

| | | | |
|---|---|---|---|
| CN | 105226069 | A | 1/2016 |
| CN | 107359175 | A | 11/2017 |
| CN | 108364990 | A | 8/2018 |
| CN | 109285858 | A | 1/2019 |
| CN | 110164322 | A | 8/2019 |
| CN | 110224008 | A | 9/2019 |
| CN | 111048499 | A | 4/2020 |
| CN | 111416031 | A | 7/2020 |
| CN | 111489658 | A | 8/2020 |
| CN | 111564570 | A | 8/2020 |
| CN | 111613652 | A | 9/2020 |
| CN | 112928192 | A | 6/2021 |

OTHER PUBLICATIONS

International Search Report in International application No. PCT/CN2021/139350, mailed on Jul. 27, 2022.
Written Opinion of the International Search Authority in International application No. PCT/CN2021/139350,mailed on Jul. 27, 2022.
Chinese Office Action issued in corresponding Chinese Patent Application No. 202111506579.5 dated Jan. 28, 2023, pp. 1-8.

\* cited by examiner

10

10

DOUBLE-SIDED DISPLAY PANEL AND DOUBLE-SIDED DISPLAY DEVICE

FIELD OF INVENTION

This application relates to a field of display technology and particularly relates to a double-sided display panel and a double-sided display device.

BACKGROUND OF INVENTION

Sub-millimeter light-emitting diode (mini-LED) or micro light emitting diode display (micro-LED) will develop into one of mainstream display technologies in the future. Compared with liquid crystal display (LCD) devices and organic light-emitting diode (OLED) display devices, the Mini-LED or micro-LED has advantages of fast response times, high color gamut, and low energy consumption. The mini-LED or micro-LED displays are applied in a commercial display field, and some occasions require a double-sided display. The double-sided display means that users can view displayed content from a front side of the display device, and can also view the displayed content from a back side of the display device. However, in the prior art, a two-sided display is usually achieved by bonding two display panels together, which is not conducive to achieving a lighter and thinner display device.

Technical Problem

In the prior art, the double-sided display is usually achieved by bonding two display panels together, which is not conducive to achieving a thinner and lighter display device.

SUMMARY OF INVENTION

Embodiments of the present application provide a double-sided display panel and a double-sided display device to solve the problem that in the prior art, a double-sided display is usually realized by bonding two display panels together, which is not conducive to the realization of a thinner and lighter display device.

In a first aspect, an embodiment of the present application provides a double-sided display panel, including: a light-emitting layer including a first light-emitting unit and a second light-emitting unit arranged at intervals, wherein the first light-emitting unit emits light toward a first direction, and the second light-emitting unit emits light toward a second direction opposite to the first direction; a first connecting assembly including a first positive electrode plate and a first negative electrode plate arranged at intervals, wherein the first positive electrode plate and the first negative electrode plate are electrically connected to a side of the first light-emitting unit facing away from a light-emitting side of the first light-emitting unit; and a second connecting assembly disposed on the same side of the light-emitting layer as the first connecting assembly, wherein the second connecting assembly includes a second positive electrode plate and a second negative electrode plate arranged at intervals, a light-emitting side of the second light-emitting unit includes a connecting area and a light-emitting area, and the second positive electrode plate and the second negative electrode plate are electrically connected to the connecting area of the second light-emitting unit.

Optionally, an opening corresponding to the light-emitting area is defined between the second positive electrode plate and the second negative electrode plate to cause the light emitted by the second light-emitting unit to pass through the opening.

Optionally, the second connecting assembly further includes two metal plates, the two metal plates, the second positive electrode plate, and the second negative electrode plate are arranged at intervals in pairs, and the second positive electrode plate and the second negative electrode plate are arranged adjacently or diagonally.

Optionally, a distance between the second positive electrode plate and the second negative electrode plate is greater than a distance between the first positive electrode plate and the first negative electrode plate.

Optionally, an area of the first positive plate is greater than an area of the second positive plate, and an area of the first negative plate is greater than an area of the second negative plate.

Optionally, the double-sided display panel further includes: a driving circuit layer disposed on a side of the first connecting assembly and the second connecting assembly away from the light-emitting layer, wherein the driving circuit layer includes a first driving circuit, a second driving circuit, and a light-transmitting area, the first driving circuit is electrically connected to the first light-emitting unit through the first connecting assembly, the second driving circuit is electrically connected to the second light-emitting unit through the second connecting assembly, and the light-transmitting area is defined corresponding to the light-emitting area.

Optionally, the double-sided display panel further includes a substrate, the substrate is disposed on a side of the driving circuit layer away from the light-emitting layer, and light emitted by the second light-emitting unit can pass through the substrate.

Optionally, a height of the first light-emitting unit and a height of the second light-emitting unit in the first direction are equal.

Optionally, the first light-emitting unit and the second light-emitting unit are both Mini-LED or micro-LED.

In a second aspect, an embodiment of the present application further provides a double-sided display device, including the aforesaid double-sided display panel.

Beneficial Effect

In the double-sided display panel and the double-sided display device provided in the embodiments of the present application, a first light-emitting unit and a second light-emitting unit that can emit light in two opposite directions are disposed on the same light-emitting layer, and the light-emitting units corresponding to different light-emitting directions and the connecting assemblies have different connection manners, so that the same display panel can realize a double-sided display.

DESCRIPTION OF DRAWINGS

In order to describe the technical solutions in the embodiments of the present application more clearly, the following will briefly introduce the drawings that need to be used in the description of the embodiments. Obviously, the drawings in the description are only some embodiments of the application, and for those skilled in the art, other drawings can be obtained based on these drawings without doing creative work. In order to have a more complete understanding of the present application and its beneficial effects, the following description will be made with reference to the accompanying drawings, wherein the same reference numerals in the following description indicate the same parts.

DETAILED DESCRIPTION OF PREFERRED EMBODIMENTS

The following will clearly describe the technical solutions in the embodiments of the present application with reference to the drawings in the embodiments of the present application. Obviously, the embodiments are only a part of the present application. Based on these embodiments in the present application, all other embodiments obtained by those skilled in the art without doing creative work shall fall within the protection scope of the present application.

In order to solve the problem that in the prior art, the double-sided display is usually realized by bonding two display panels together, which is not conducive to the realization of the thinner and lighter display device, the embodiments of the present application provide a double-sided display panel and a double-sided display device, which will be described with reference to the accompanying drawings.

Figure 1:
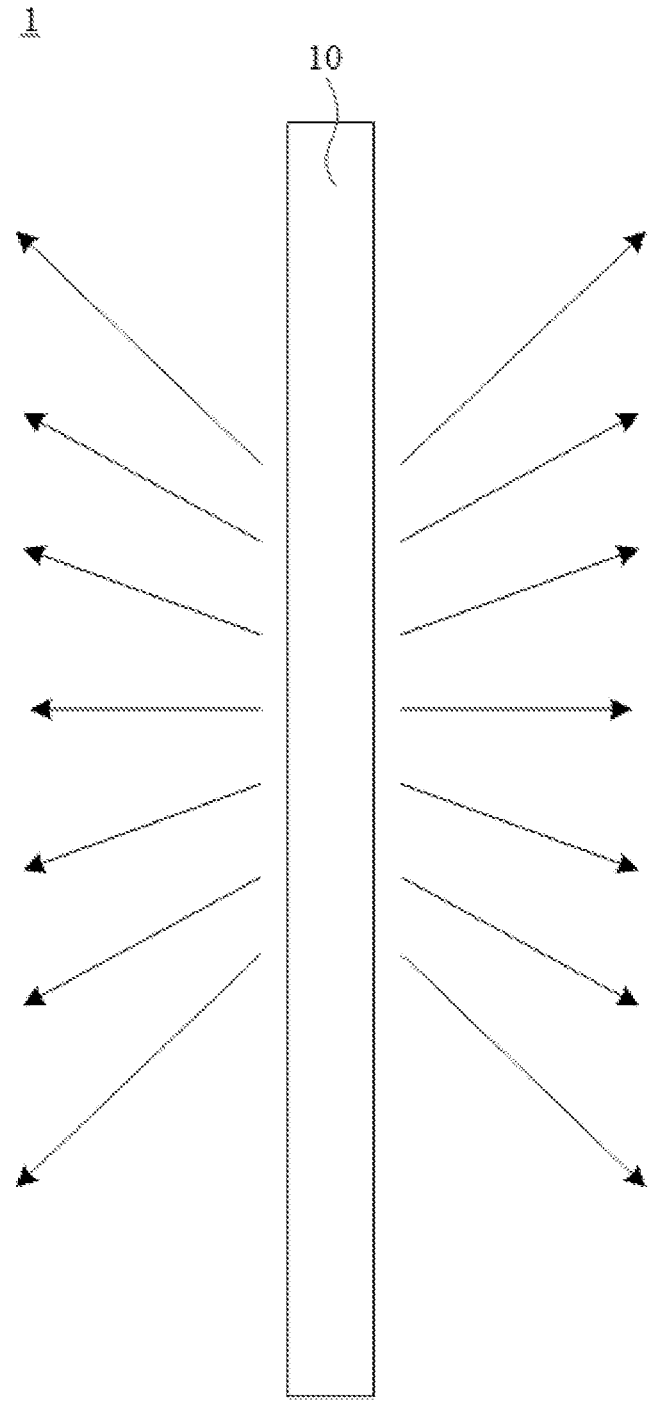
FIG. 1 is a schematic structural diagram of a double-sided display device provided by an embodiment of the application.

Exemplarily, please refer to FIG. 1, which is a schematic structural diagram of a double-sided display device provided by an embodiment of the application. The embodiment of the present application provides a double-sided display device 1, and the double-sided display device 1 may include a double-sided display panel 10. The double-sided display device 1 is a device that can display images from two opposite directions. For example, a double-sided display device 1 is used in applications requiring double-sided display such as the service window industry. However, in the prior art, the double-sided display is usually achieved by bonding two display panels together, which is not conducive to achieving a lighter and thinner display device, and the cost is relatively high.

The double-sided display panel 10 of the embodiment of the present application can be used to solve the aforesaid problems. The structural design of the double-sided display panel 10 will be described below.

Figure 2:
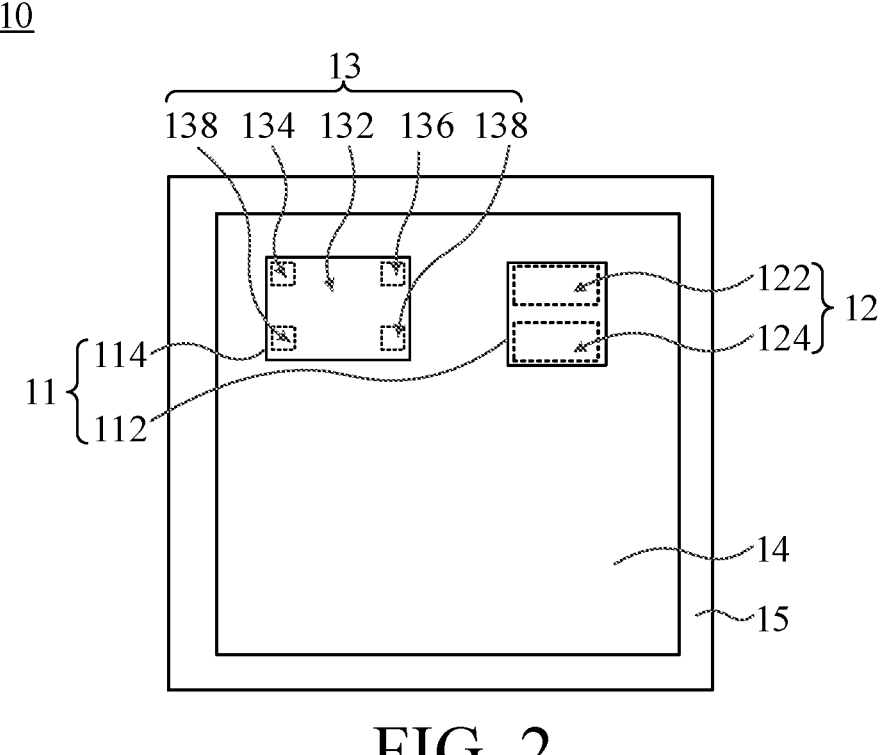
FIG. 2 is a first schematic structural diagram of a double-sided display panel in the double-sided display device shown in FIG. 1.
Figure 3:
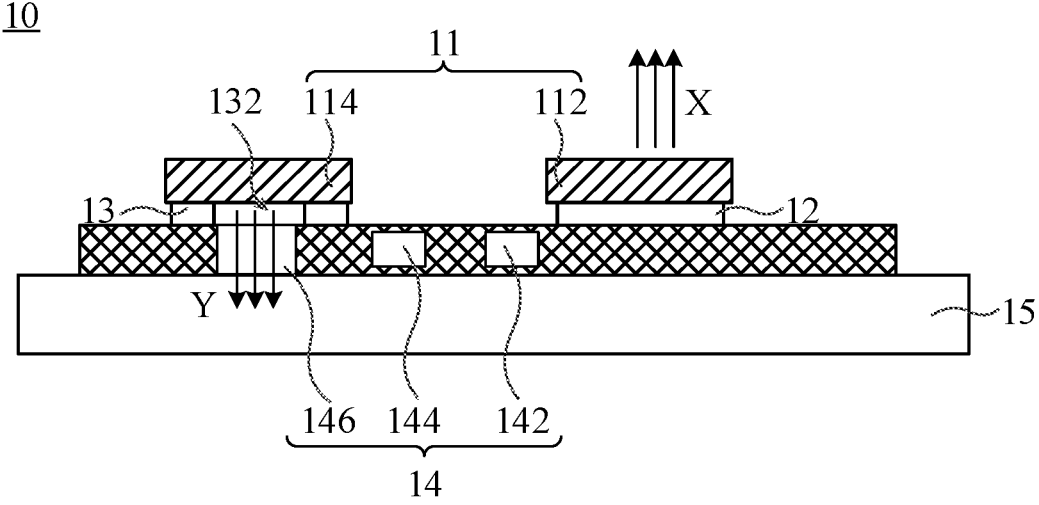
FIG. 3 is a schematic cross-sectional view of a part of the double-sided display panel shown in FIG. 2.

Exemplary, please refer to FIG. 1, and refer to FIG. 2 and FIG. 3. FIG. 2 is a first schematic structural diagram of a double-sided display panel in the double-sided display device shown in FIG. 1. FIG. 3 is a schematic cross-sectional view of a part of the double-sided display panel shown in FIG. 2. The double-sided display panel 10 provided in the embodiment of the present application may include a light-emitting layer 11, a first connecting assembly 12, and a second connecting assembly 13. The light-emitting layer 11 includes a first light-emitting unit 112 and a second light-emitting unit 114 arranged at intervals. The first light-emitting unit 112 emits light toward a first direction X, and the second light-emitting unit 114 emits light toward a second direction Y opposite to the first direction X. The first connecting assembly 12 may include a first positive electrode plate 122 and a first negative electrode plate 124, and the first positive electrode plate 122 and the first negative electrode plate 124 are respectively electrically connected to a side of the first light-emitting unit 112 facing away from the light-emitting side. The second connecting assembly 13 and the first connecting assembly 12 are provided on the same side of the light-emitting layer 11. The second connecting assembly 13 includes a second positive electrode plate 134 and a second negative electrode plate 136 arranged at intervals. The light-emitting side of the second light-emitting unit 114 may include a connecting area and a light-emitting area, and the second positive electrode plate 134 and the second negative electrode plate 136 are electrically connected to the connecting area of the second light-emitting unit 114, respectively. A first light-emitting unit 112 and a second light-emitting unit 114 that can emit light in two opposite directions are provided on the same light-emitting layer 11, and the light-emitting units corresponding to different light-emitting directions and the connecting assembly have different connection manners so that the same display panel can realize a double-sided display. This solution does not increase the thickness of the display panel, which is more conducive to the development of the light and thin double-sided display device 1, and the cost is reduced compared to the solution of bonding two display panels.

Wherein, the first light-emitting unit 112 and the second light-emitting unit 114 may both be Mini-LED or micro-LED. It should be noted that with the development of display technology, micro-LED or Mini-LED technology has come out. The micro-LED or Mini-LED technology refers to the technology of integrating micro-size light-emitting diode (LED) arrays with high density on a substrate. The size of each micro-LED or Mini-LED is only about 1 to 10 microns. Through this technology, a high-resolution micro-LED or Mini-LED display panel can be formed. The micro-LED has advantages of high luminous efficiency, low energy consumption, and high resolution.

It should be noted that, for micro-LED or Mini-LED, a direct display solution is usually adopted. In other words, the first light-emitting unit 112 can be understood as a monochromatic lamp bead, and each monochromatic lamp bead can directly display a corresponding color. For example, the first light-emitting unit 112 may be a red lamp bead, a green lamp bead, or a blue lamp bead. Three first light-emitting units 112 of different colors can be regarded as one pixel unit. A plurality of pixel units arranged in a certain regularity can display images. For the second light-emitting unit 114, reference may be made to the description of the first light-emitting unit 112, which will not be repeated herein.

The light-emitting layer 11 composed of the first light-emitting unit 112 and the second light-emitting unit 114 may also be referred to as a pixel layer. The number of the first light-emitting unit 112 and the number of the second light-emitting unit 114 in the light-emitting layer 11 are not limited. The number of the first light-emitting unit 112 and the number of the second light-emitting unit 114 can be designed according to actual requirements.

The first connecting assembly 12 is configured to connect the first light-emitting unit 112, and the first connecting assembly 12 can be connected to a driving circuit to drive the operation of the first light-emitting unit 112. The first connecting assembly 12 may include a first positive plate 122 and a first negative plate 124. The first positive electrode plate 122 and the first negative electrode plate 124 are spaced apart to prevent interference between the first positive electrode plate 122 and the first negative electrode plate 124 or to prevent interference between the electrode of the first light-emitting unit 112 and the first positive electrode plate 122 and the connection with the first negative electrode plate 124. In order to facilitate the manufacture of the first positive electrode plate 122 and the first negative electrode plate 124, the first positive electrode plate 122 and the first negative electrode plate 124 may be designed to have the same size. It should be noted that the first light-emitting unit 112 usually includes a positive electrode and a negative electrode. The positive electrode is connected to the first positive plate 122 and the negative electrode is connected to the first negative plate 124 to drive the operation of the first light-emitting unit 112. Wherein, both the positive electrode and the negative electrode of the first light-emitting unit 112 can be disposed on a side surface of the first light-emitting unit 112 facing away from the light-emitting side. That is, the first positive plate 122 and the first negative plate 124 are respectively electrically connected to the side of the first light-emitting unit 112 facing away from the light-emitting side. Therefore, the light-emitting area of the first light-emitting unit 112 is not affected by the connecting plate, and the area of the light-emitting side of the first light-emitting unit 112 can be fully utilized to make the light-emitting area as large as possible.

The second connecting assembly 13 is configured to connect the second light-emitting unit 114, and the second connecting assembly 13 can be connected to a driving circuit to drive the operation of the second light-emitting unit 114. The second connecting assembly 13 can be understood as an intermediate medium for connecting the second light-emitting unit 114 and the driving circuit. The second connecting assembly 13 includes a second positive electrode plate 134 and a second negative electrode plate 136, and the second positive electrode plate 134 and the second negative electrode plate 136 can be electrically connected to the connecting area of the second light-emitting unit 114. An opening 132 is defined between the second positive electrode plate 134 and the second negative electrode plate 136, and the opening 132 may correspond to the light-emitting area. Therefore, the light emitted by the second light-emitting unit 114 can pass through the opening 132. It should be noted that the opening 132 may be filled with a light-transmitting material to make the packaging of the second light-emitting unit 114 more stable. It should be noted that the second positive electrode plate 134 and the second negative electrode plate 136 are electrically connected to the light-emitting side of the second light-emitting unit 114. This is because the first light-emitting unit 112 and the second light-emitting unit 114 may be located on the same plane to make the thickness of the first light-emitting unit 112 and the second light-emitting unit 114 as small as possible. The connecting side of the second light-emitting unit 114 may be disposed on the same side as the connecting side of the first light-emitting unit 112, and the first light-emitting unit 112 and the second light-emitting unit 114 disposed on the same side can be easily connected to the driving circuit, thereby further reducing the thickness of the double-sided display panel 10.

Exemplary, please continue to refer to FIG. 2 and FIG. 3. The connecting area of the second light-emitting unit 114 may be disposed at the edge position of the second light-emitting unit 114, and the light-emitting area is correspondingly disposed at the center position of the second light-emitting unit 114. The second positive electrode plate 134 and the second negative electrode plate 136 may be disposed on both sides of the second light-emitting unit 114, and the opening 132 is defined corresponding to the light-emitting area. In addition, the second connecting assembly 13 may further include two metal plates 138, and the two metal plates 138, the second positive electrode plate 134, and the second negative electrode plate 136 are spaced apart in pairs. The second positive electrode plate 134 and the second negative electrode plate 136 may be arranged adjacently or diagonally. For example, the sizes of the two metal plates 138, the second positive electrode plate 134, and the second negative electrode plate 136 may all be the same. The two metal plates 138, the second positive electrode plate 134, and the second negative electrode plate 136 may be arranged in two columns and two rows. Therefore, the second positive electrode plate 134 and the second negative electrode plate 136 may be arranged adjacent to each other or arranged diagonally, which is not limited herein. The distance between the second positive electrode plate 134 and the second negative electrode plate 136 may be greater than the distance between the first positive electrode plate 122 and the first negative electrode plate 124. In other words, the distance between one metal plate 138 and the second positive electrode plate 134, the second negative electrode plate 136, or another metal plate 138 may be greater than the distance between the first positive electrode plate 122 and the first negative electrode plate 124. In this way, the second connecting assembly 13 can reserve enough area for defining the opening 132 to increase the light-emitting area of the second light-emitting unit 114. Wherein, for example, the area of the first positive electrode plate 122 may be greater than the area of the second positive electrode plate 134, and the area of the first negative electrode plate 124 may be greater than the area of the second negative electrode plate 136. This is because the first positive electrode plate 122 and the first negative electrode plate 124 do not need to provide a space reserved for the first light emitting unit 112 to emit light.

Figure 4:
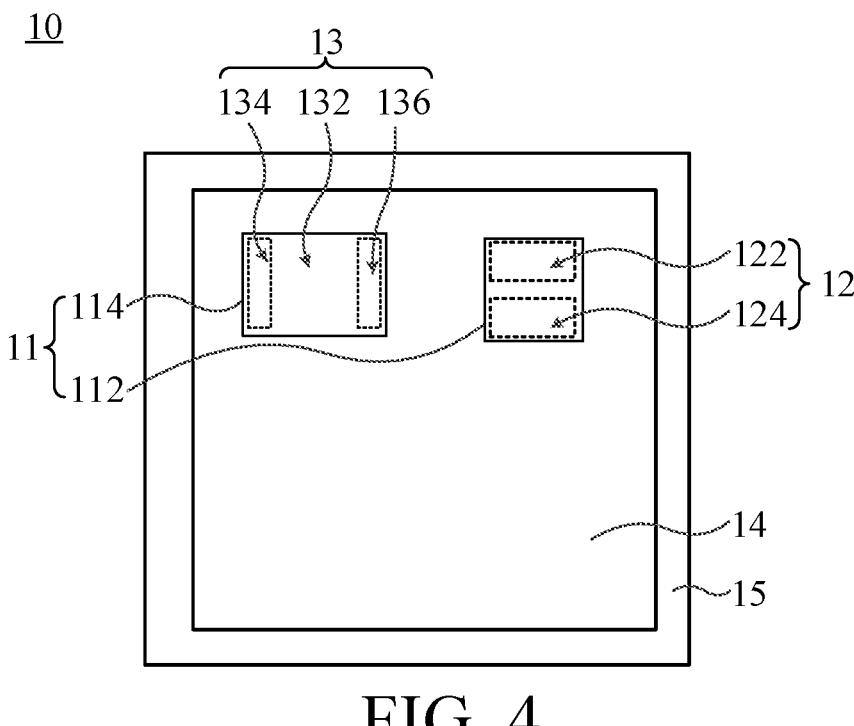
FIG. 4 is a second schematic structural diagram of a double-sided display panel in the double-sided display device shown in FIG. 1.

The configuration of the second connecting assembly 13 is not limited to the aforesaid manner. Exemplarily, please refer to FIG. 1 to FIG. 3, and FIG. 4 together. FIG. 4 is a second schematic structural diagram of a double-sided display panel in the double-sided display device shown in FIG. 1. The second connecting assembly 13 may also only include the second positive electrode plate 134 and the second negative electrode plate 136. Therefore, the area of the second positive electrode plate 134 can be greater than the sum of the areas of the second positive electrode plate 134 and one metal plate 138 in FIG. 2. In this case, the second positive electrode plate 134 and the second negative electrode plate 136 are disposed on the two edges of the second light-emitting unit 114 opposite to each other. The opening 132 is defined at the middle position of the second light-emitting unit 114 to provide a passage for the light emitted by the second light-emitting unit 114 to pass through. For the cross-sectional schematic diagram of a part of the structure in the double-sided display panel 10 corresponding to FIG. 4, reference may be made to FIG. 3 and the above description, which will not be repeated herein.

It can be understood that the second connecting assembly 13 may only include the second positive electrode plate 134 and the second negative electrode plate 136, as shown in FIG. 4. The second connecting assembly 13 may also include a second positive electrode plate 134, a second negative electrode plate 136, and two metal plates 138, as shown in FIG. 2. Certainly, the second connecting assembly 13 can also have other configuration forms, which will not be given as examples herein.

Figure 5:
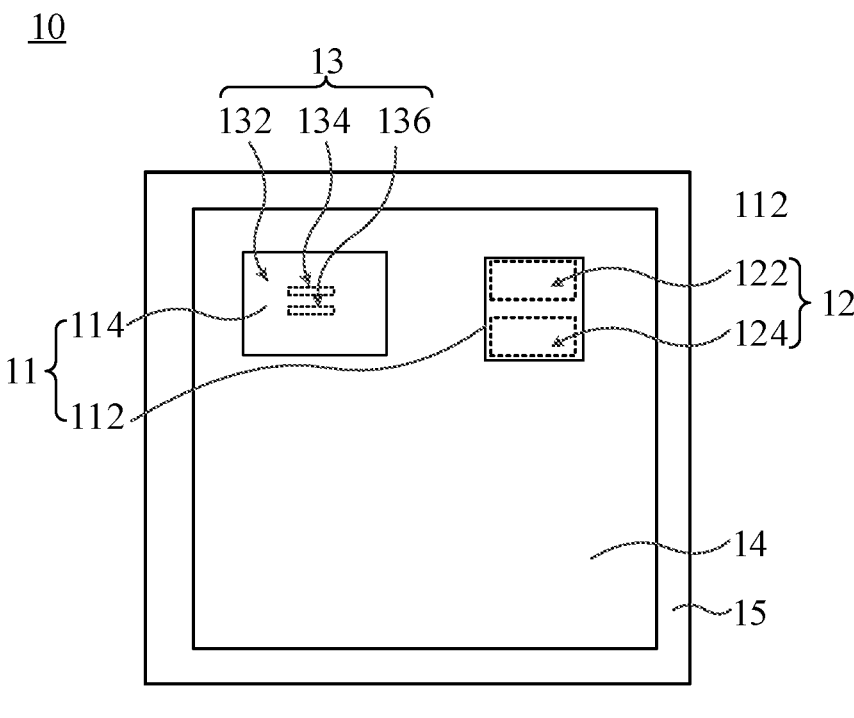
FIG. 5 is a third schematic structural diagram of a double-sided display panel in the double-sided display device shown in FIG. 1.
Figure 6:
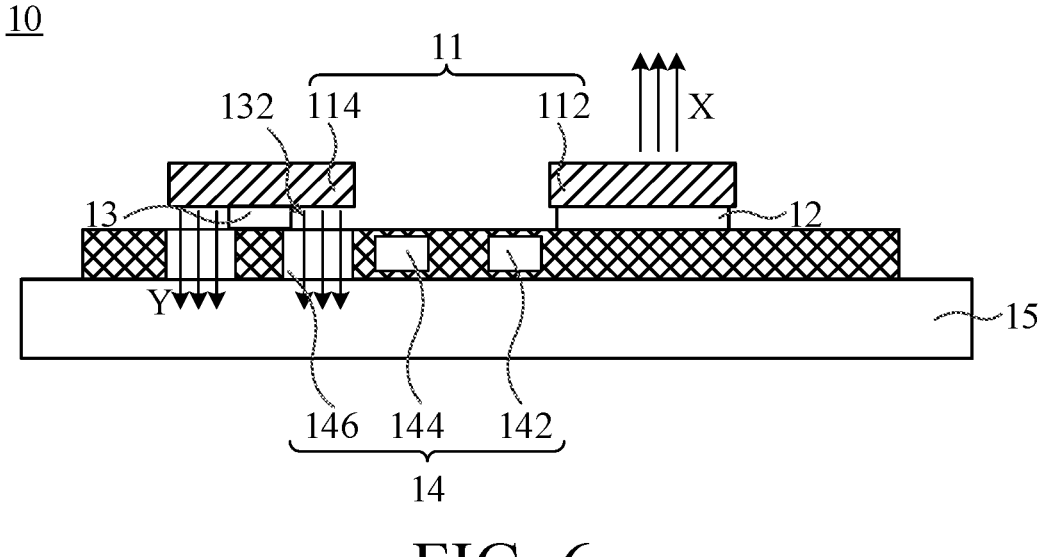
FIG. 6 is a schematic cross-sectional view of a part of the double-sided display panel shown in FIG. 5.

Exemplary, please refer to FIG. 1 to FIG. 4, FIG. 5, and FIG. 6. FIG. 5 is a third schematic structural diagram of a double-sided display panel in the double-sided display device shown in FIG. 1. FIG. 6 is a schematic cross-sectional view of a part of the double-sided display panel shown in FIG. 5. The connecting area of the second light-emitting unit 114 can be disposed at the center of the second light-emitting unit 114, and the light-emitting area can be arranged around the connecting area. Correspondingly, the second positive electrode plate 134 and the second negative electrode plate 136 are relatively disposed at the center position of the second light-emitting unit 114, and the second positive electrode plate 134 and the second negative electrode plate 136 are electrically connected to the light-emitting side of the second light-emitting unit 114, respectively.

It can be understood that the second connecting assembly 13 needs to have an opening 132, a second positive electrode plate 134, and a second negative electrode plate 136. The second positive electrode plate 134 and the second negative electrode plate 136 are electrically connected to the second light emitting unit 114 to provide a driving circuit. The shapes of the second positive electrode plate 134 and the second negative electrode plate 136 can be defined as required. In some embodiments, the configuration of the second positive electrode plate 134 and the second negative electrode plate 136 may satisfy the following conditions: On the one hand, it is necessary to support the second light-emitting unit 114 for stable installation. On the other hand, the position of the opening 132 is reserved to provide a reserved space for the second light-emitting unit 114 to emit light.

Certainly, the configuration of the second connecting assembly 13 is not limited to the aforesaid methods. It is only required to meet the light-emitting requirements of the second light-emitting unit 114 and the display requirements of the double-sided display panel 10, and no examples are given herein.

Exemplarily, please continue to refer to FIG. 2 to FIG. 6. The double-sided display panel 10 may further include a driving circuit layer 14 and a substrate 15. The driving circuit layer 14 is disposed on a side of the first connecting assembly 12 and the second connecting assembly 13 away from the light-emitting layer 11.

The driving circuit layer 14 may include a first driving circuit 142, a second driving circuit 144, and a light-transmitting area 146. The first driving circuit 142 is electrically connected to the first light-emitting unit 112 through the first connecting assembly 12, and the second driving circuit 144 is electrically connected to the second light-emitting unit 114 through the second connecting assembly 13. The light-transmitting area 146 is disposed corresponding to the light-emitting area so that the light emitted by the second light-emitting unit 114 can pass through the driving circuit layer 14. It should be noted that the first driving circuit 142 and the second driving circuit 144 may each include a plurality of driving thin-film transistors. The driving thin film transistor is electrically connected to the first light-emitting unit 112 or the second light-emitting unit 114 to drive the operation of the first light-emitting unit 112 or the second light-emitting unit 114. The substrate 15 can be disposed on the side of the driving circuit layer 14 away from the light-emitting layer 11. The substrate 15 is configured to support or carry the driving circuit layer 14, the first connecting assembly 12, the second connecting assembly 13, and the light-emitting layer 11. In addition, the light emitted by the second light-emitting unit 114 can pass through the substrate 15. It is understandable that substrate 15 can be a transparent material, and a light-shielding layer or a shielding layer may be provided between substrate 15 and the driving circuit layer 14 to shield the driving thin film transistors of the driving circuit layer 14. The light-shielding layer or the shielding layer is defined with a channel through which the light emitted by the second light-emitting unit 114 can pass through so that the second light-emitting unit 114 can emit light toward the second direction Y. That is, the user can view the display screen from the second direction Y.

It should be noted that the material of the driving circuit layer 14 corresponding to the position of each opening 132 is a transparent material, so that the light emitted by the second light-emitting unit 114 can pass through the driving circuit layer 14, thereby realizing the double-sided display of the double-sided display panel 10. Similarly, the material corresponding to the position of each opening 132 of the substrate 15 can also be a transparent material.

It should be noted that the first light-emitting unit 112 is located on the side of the first connecting assembly 12 away from the driving circuit layer 14. The second light-emitting unit 114 is located on a side of the second connecting assembly 13 away from the driving circuit layer 14, that is, the first light-emitting unit 112 and the second light-emitting unit 114 are both located on the side of the first connecting assembly 12 and the second connecting assembly 13 away from the driving circuit layer 14. In addition, the heights of the first light-emitting unit 112 and the second light-emitting unit 114 in the first direction X are equal. It can be understood that the first light-emitting unit 112 and the second light-emitting unit 114 are located on the same side and have the same height so that the thickness of the double-sided display panel 10 can be consistent with the thickness of a single-sided display panel. This is of great significance to the lightness and thinness of the double-sided display device 1.

The light-emitting area of the first light-emitting unit 112 and the light-emitting area of the second light-emitting unit 114 can be equal or different. When the light-emitting area of the first light-emitting unit 112 is equal to the light-emitting area of the second light-emitting unit 114, the area of the second light-emitting unit 114 may be larger than the area of the first light-emitting unit 112 because the second light-emitting unit 114 needs to reserve an area for connecting with the connecting board 130.

Exemplarily, a light-shielding layer may be provided between the first light-emitting unit 112 and the second light-emitting unit 114, so that the light emitted by the first light-emitting unit 112 and the light emitted by the second light-emitting unit 114 do not interfere with each other, thereby improving the quality and effect of the double-sided display. Wherein, a reflective layer or a light-shielding layer may be further provided on the side of the first light-emitting unit 112 away from the light-emitting side, to improve the light-emitting brightness of the first light-emitting unit 112. Similarly, the side of the second light-emitting unit 114 away from the light-emitting side may also be provided with a reflective layer or a light-shielding layer.

In the double-sided display panel 10 and the double-sided display device 1 provided by the embodiments of the present application, the double-sided display panel includes a light-emitting layer 11, a first connecting assembly 12, and a second connecting assembly 13. The light-emitting layer 11 includes a first light-emitting unit 112 and a second light-emitting unit 114 arranged at intervals. The first light-emitting unit 112 emits light in a first direction X, and the second light-emitting unit 114 emits light in a second direction Y opposite to the first direction X. The first connecting assembly 12 includes a first positive electrode plate 122 and a first negative electrode plate 124, and the first positive electrode plate 122 and the first negative electrode plate 124 are respectively electrically connected to a side of the first light-emitting unit 112 facing away from the light-emitting side. The second connecting assembly 13 and the first connecting assembly 12 are disposed on the same side of the light-emitting layer 11. The second connecting assembly 13 includes a second positive electrode plate 134 and a second negative electrode plate 136 arranged at intervals. The light-emitting side of the second light-emitting unit 114 includes a connecting area and a light-emitting area. The second positive electrode plate 134 and the second negative electrode plate 136 are respectively electrically connected to the connecting area of the second light-emitting unit 114. A first light-emitting unit 112 and a second light-emitting unit 114 that can emit light in two opposite directions are provided on the same light-emitting layer 11, and the light-emitting units corresponding to different light-emitting directions and the connecting assembly have different connection manners so that the same display panel can achieve double-sided display without increasing the thickness of the display panel. Therefore, it is more conducive to the development of thinner and lighter double-sided display device 1, and the cost is reduced compared to the solution in which two display panels are bonded together.

In the above-mentioned embodiments, the description of each embodiment has its own focus. For parts that are not described in detail in an embodiment, reference may be made to related descriptions of other embodiments.

In the description of this application, the terms "first" and "second" are only used for descriptive purposes, and cannot be understood as indicating or implying relative importance or implicitly indicating the number of indicated technical features. Thus, the features defined with "first" and "second" may explicitly or implicitly include one or more features.

The double-sided display panel and the double-sided display device provided by the embodiments of the application are described in detail above. Specific examples are used in this article to illustrate the principles and implementation of the application, and the descriptions of the examples are only used to help understand the methods and core ideas of the application. In addition, for those skilled in the art, according to the ideas of this application, there will be changes in the specific implementation and the scope of the application. As mentioned above, the content of this specification should not be construed as a limitation to this application.

What is claimed is:

1. A double-sided display device, comprising a double-sided display panel, and the double-sided display panel comprising:

a light-emitting layer comprising a first light-emitting unit and a second light-emitting unit arranged at intervals, wherein the first light-emitting unit is configured to emit light toward a first direction, and the second light-emitting unit is configured to emit light toward a second direction opposite to the first direction;

a first connecting assembly comprising a first positive electrode plate and a first negative electrode plate arranged at intervals, wherein the first positive electrode plate and the first negative electrode plate are electrically connected to a side of the first light-emitting unit facing away from a light-emitting side of the first light-emitting unit; and a second connecting assembly disposed on a same side of the light-emitting layer as the first connecting assembly, wherein the second connecting assembly comprises a second positive electrode plate and a second negative electrode plate arranged at intervals, a light-emitting side of the second light-emitting unit comprises a connecting area and a light-emitting area, and the second positive electrode plate and the second negative electrode plate are electrically connected to the connecting area of the second light-emitting unit;

wherein in a top view of the double-sided display panel, the connecting area is disposed at a center of the second light-emitting unit, the light-emitting area is disposed around the connecting area, the second positive electrode plate and the second negative electrode plate are disposed corresponding to each other at the center of the second light-emitting unit, and both the second positive electrode plate and the second negative electrode plate are disposed on a same surface of the second light-emitting unit and connected to the light-emitting side of the second light-emitting unit; and wherein the second connecting assembly is provided with a light-emitting space located in the light-emitting area, the light-emitting space is disposed surrounding the connecting area, and the light-emitting space presents a square ring shape in the top view of the double-sided display panel, wherein light emitted by the second light-emitting unit is capable of being emitted from the light-emitting space in a direction perpendicular to a plane where the second light-emitting unit is located.

2. The double-sided display device of claim 1, wherein the second positive electrode plate and the second negative electrode plate are arranged adjacently or diagonally.

3. The double-sided display device of claim 2, wherein a distance between the second positive electrode plate and the second negative electrode plate is greater than a distance between the first positive electrode plate and the first negative electrode plate.

4. The double-sided display device of claim 2, wherein an area of the first positive electrode plate is greater than an area of the second positive electrode plate, and an area of the first negative electrode plate is greater than an area of the second negative electrode plate.

5. The double-sided display device of claim 1, wherein the double-sided display panel further comprises:

a driving circuit layer disposed on a side of the first connecting assembly and the second connecting assembly away from the light-emitting layer, wherein the driving circuit layer comprises a first driving circuit, a second driving circuit, and a light-transmitting area, the first driving circuit is electrically connected to the first light-emitting unit through the first connecting assembly, the second driving circuit is electrically connected to the second light-emitting unit through the second connecting assembly, and the light-transmitting area is defined corresponding to the light-emitting area.

6. The double-sided display device of claim 5, wherein a height of the first light-emitting unit and a height of the second light-emitting unit in the first direction are equal.

7. A double-sided display panel comprising:

a light-emitting layer comprising a first light-emitting unit and a second light-emitting unit arranged at intervals, wherein the first light-emitting unit is configured to emit light toward a first direction, and the second light-emitting unit is configured to emit light toward a second direction opposite to the first direction;

a first connecting assembly comprising a first positive electrode plate and a first negative electrode plate arranged at intervals, wherein the first positive electrode plate and the first negative electrode plate are electrically connected to a side of the first light-emitting unit facing away from a light-emitting side of the first light-emitting unit; and a second connecting assembly disposed on a same side of the light-emitting layer as the first connecting assembly, wherein the second connecting assembly comprises a second positive electrode plate and a second negative electrode plate arranged at intervals, a light-emitting side of the second light-emitting unit comprises a connecting area and a light-emitting area, and the second positive electrode plate and the second negative electrode plate are electrically connected to the connecting area of the second light-emitting unit;

wherein in a top plan view of the double-sided display panel, the connecting area is disposed at a center of the second light-emitting unit, the light-emitting area is disposed around the connecting area, the second positive electrode plate and the second negative electrode plate are disposed corresponding to each other at the center of the second light-emitting unit, and both the second positive electrode plate and the second negative electrode plate are disposed on a same surface of the second light-emitting unit and connected to the light-emitting side of the second light-emitting unit; and wherein the second connecting assembly is provided with a light-emitting space located in the light-emitting area, the light-emitting space is disposed surrounding the connecting area, and the light-emitting space presents a square ring shape in the top view of the double-sided display panel, wherein light emitted by the second light-emitting unit is capable of being emitted from the light-emitting space in a direction perpendicular to a plane where the second light-emitting unit is located.

8. The double-sided display panel of claim 7, wherein the second connecting assembly further comprises a first metal plate and a second metal plate electrically connected to the connecting area; in a top plan view, every two of the first metal plate, the second metal plate, the second positive electrode plate, and the second negative electrode plate are spaced apart, and the first metal plate, the second metal plate, the second positive electrode plate, and the second negative electrode plate are arranged in corner areas of the second light-emitting unit.

9. The double-sided display panel of claim 7, wherein the light-emitting area is provided with an opening configured to cause light emitted by the second light-emitting unit to pass through, and the opening is filled with a light-transmitting material.

10. The double-sided display panel of claim 7, wherein the second positive electrode plate and the second negative electrode plate are arranged adjacently.

11. The double-sided display panel of claim 7, wherein a distance between the second positive electrode plate and the second negative electrode plate is greater than a distance between the first positive electrode plate and the first negative electrode plate.

12. The double-sided display panel of claim 7, wherein an area of the first positive electrode plate is greater than an area of the second positive electrode plate, and an area of the first negative electrode plate is greater than an area of the second negative electrode plate.

13. The double-sided display panel of claim 7, further comprising a driving circuit layer disposed on a side of the first connecting assembly and the second connecting assembly away from the light-emitting layer, wherein the driving circuit layer comprises a first driving circuit, a second driving circuit, and a light-transmitting area, the first driving circuit is electrically connected to the first light-emitting unit through the first connecting assembly, the second driving circuit is electrically connected to the second light-emitting unit through the second connecting assembly, and the light-transmitting area is defined corresponding to the light-emitting area.

14. The double-sided display panel of claim 13, further comprising a substrate, wherein the substrate is disposed on a side of the driving circuit layer away from the light-emitting layer, and light emitted by the second light-emitting unit can pass through the substrate.

15. The double-sided display panel of claim 14, wherein a light-shielding layer is provided between the substrate and the driving circuit layer, and the light-shielding layer is defined with a channel to cause the light emitted by the second light-emitting unit can be transmitted.

16. The double-sided display panel of claim 7, wherein a height of the first light-emitting unit and a height of the second light-emitting unit in the first direction are equal.

17. The double-sided display panel of claim 7, wherein the first light-emitting unit and the second light-emitting unit are both Mini-LED or micro-LED.

18. The double-sided display panel of claim 7, wherein both the first light-emitting unit and the second light-emitting unit are provided with a light shield to enable light emitted by the first light-emitting unit and light emitted by the second light-emitting unit not to interfere with each other.

* * * * *